(12) United States Patent
Nakata et al.

(10) Patent No.: US 6,297,658 B1
(45) Date of Patent: Oct. 2, 2001

(54) WAFER BURN-IN CASSETTE AND METHOD OF MANUFACTURING PROBE CARD FOR USE THEREIN

(75) Inventors: Yoshiro Nakata, Kyoto; Shinichi Oki, Osaka, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/176,194

(22) Filed: Oct. 21, 1998

(30) Foreign Application Priority Data

Oct. 31, 1997 (JP) ................................................ 9-300326

(51) Int. Cl.$^7$ ............................................................ G01R 31/28
(52) U.S. Cl. ............................................... 324/765; 324/754
(58) Field of Search .................................. 324/754, 765, 324/756, 758, 761; 439/482, 42, 74

(56) References Cited

U.S. PATENT DOCUMENTS 5,430,816 * 7/1995 Furuya et al. ............................ 385/33
5,945,834 * 8/1999 Nakata et al. ......................... 324/754

* cited by examiner

Primary Examiner—Vinh P. Nguyen
Assistant Examiner—Paresh Patel
(74) Attorney, Agent, or Firm—Eric J. Robinson; Nixon Peabody LLP

(57) ABSTRACT

A wafer tray has a wafer mount portion for carrying a semiconductor wafer formed with a plurality of semiconductor chips. A probe card composed of an elastic material and disposed in opposing relation to the wafer mount portion of the wafer tray has bumps to be connected to the respective electrode pads of the semiconductor chips on the top surface thereof. A holding board is provided to hold the back surface of the probe card. An annular sealing member is disposed on the wafer tray externally of the wafer mount portion and defines a first sealed space in combination with the wafer tray and the probe card. The probe card has connection holes for connecting the first sealed space to a second sealed space formed between the probe card and the holding board.

8 Claims, 12 Drawing Sheets

WAFER BURN-IN CASSETTE AND METHOD OF MANUFACTURING PROBE CARD FOR USE THEREIN

BACKGROUND OF THE INVENTION

The present invention relates to a wafer burn-in cassette for performing a simultaneous burn-in process with respect to a plurality of semiconductor integrated circuit elements (hereinafter referred to as semiconductor chips) formed in a semiconductor wafer and to a method of manufacturing a probe card for use in the wafer burn-in cassette.

In the process of fabricating a conventional semiconductor integrated circuit device, an electrical connection is provided between a semiconductor chip and a leadframe by a bonding wire and then the semiconductor chip and the leads of the leadframe are sealed with a resin or ceramic to be mounted on a printed circuit board.

To meet the demand for an electronic device reduced in both size and price, there has been developed a method of mounting, on a circuit board, a semiconductor integrated circuit device as a bare chip cut out of a semiconductor wafer. The bare chip used in the method is preferably a quality-assured bare chip supplied at lower price.

For the quality assurance of a bare chip, it is required to perform a simultaneous burn-in process with respect to a plurality of semiconductor chips formed in a semiconductor wafer and thereby test the semiconductor chips for electric characteristics.

To satisfy the requirement, there has been proposed a wafer burn-in cassette as disclosed in U.S. Pat. application Ser. No. 08/358609, which comprises: a wafer tray for holding a semiconductor wafer formed with a plurality of semiconductor chips; a probe card disposed in opposing relation to the semiconductor wafer held by the wafer tray and having bumps to be connected to the respective external terminals of the semiconductor chips of the semiconductor wafer; and an annular sealing member disposed between the wafer tray and the probe card to define a sealed space in combination with the wafer tray and the probe card.

Referring to FIGS. 10 and 11, the foregoing wafer burn-in cassette will be described. FIG. 10 shows the cross-sectional structure of the wafer burn-in cassette. FIG. 11 shows the partially enlarged cross-sectional structure of the wafer burn-in cassette.

As illustrated in FIG. 10, the wafer tray 11 holding a semiconductor wafer 10 and a wiring board 13 holding an elastic probe card 12 made of a polyimide resin are disposed in opposing relation to each other. On the other hand, an annular sealing member 14 is formed around the perimeter of the wafer tray 11. When the wafer tray 11 and the probe card 12 are brought closer to each other, a first sealed space 15 is defined by the wafer tray 11, the probe card 12, and the sealing member 14.

As illustrated in FIG. 11, each of the semiconductor chips formed in the semiconductor wafer 10 has an electrode pad 16.

As illustrated in FIGS. 10 and 11, bumps 17 are provided on the portions of the probe card 12 corresponding to the electrode pads 16 of the semiconductor chips in the semiconductor wafer 10, while the peripheral portion of the probe card 12 is held by a rigid ring 18. Isolated patterns 19 composed of, e.g., copper are formed on the side of the probe card 12 opposite to the bumps 17 to be integral with the bumps 17. Since the probe card 12 is held between the bumps 17 and the isolated patterns 19, the bumps 17 and the isolated patterns 19 never fall out of the probe card 12.

As illustrated in FIG. 11, the wiring board 13 is provided with multilayer wiring 20 having one terminal connected to a test system (not shown) for supplying a test voltage such as a power-source voltage, ground voltage, or signal voltage and with anisotropic conductive rubber 21 for electrically connecting the other terminal of the multilayer wiring 20 to the bumps 17.

As illustrated in FIG. 10, a valve 22 connected to evacuating means (not shown) is provided in a side face of the wafer tray 11, while an annular groove 23 connected to the first sealed space 15 and to the valve 22 is formed in the top face of the wafer tray 11 to be interposed between the semiconductor wafer 10 and the sealing member 14.

When the valve 22 is connected to the evacuating means to evacuate the first sealed space 15, the wafer tray 11 and the probe card 12 are brought much closer to each other than in FIG. 10, so that electrical connections are provided between the respective electrode pads 16 of the semiconductor chips in the semiconductor wafer 10 and the corresponding bumps 17 of the probe card 12. Thereafter, the electric characteristics of the semiconductor chips are evaluated by using the test system which applies the test voltage to each of the semiconductor chips in the semiconductor wafer 10 and receives an output signal from each of the semiconductor chips.

While the evacuation of the first sealed space 15 has thus brought the wafer tray 11 and the probe card 12 much closer to each other and provided electrical connections between the respective electrode pads 16 of the semiconductor chips in the semiconductor wafer 10 and the corresponding bumps 17 of the probe card 12, it also produces a pressure difference between the first sealed space 15 and a second sealed space 25 defined by the probe card 12 and the anisotropic conductive rubber 21 of the wiring board 13. On the other hand, the probe card 12 having elasticity is pulled toward the first sealed space 15 to be partially in contact with the semiconductor wafer 10 and the wafer tray 11, as shown in FIG. 12.

However, since the distance between each of the bumps 17 and the sealing member 14 over the probe card 12 is larger than the distance between the adjacent bumps 17 over the probe card 12, the region of the probe card 12 extending between the bumps 17 and the sealing member 14 is elongated to a greater degree than the region of the probe card 12 extending between the adjacent bumps 17. As a result, the bumps 17 disposed on the peripheral portion of the probe card 12 move outwardly toward the sealing member 14, which causes the first problem that electrical connections are less likely to be achieved between the bumps 17 and the electrode pads 16 of the semiconductor wafer 10.

Although the difference between the distance between each of the bumps 17 and the sealing member 14 over the probe card 12 and the distance between the adjacent bumps 17 over the probe card 12 is reduced by inwardly shifting the position of the sealing member 14 toward the bumps 17 on the peripheral portion, it is impossible to prevent the region extending between the sealing member 14 and the bumps 17 from being elongated to a greater degree than the region of the probe card 12 extending between the adjacent bumps 17 due to the level difference equivalent to the thickness of the semiconductor wafer 10, which is observed on the peripheral portion of the wafer tray 11.

Moreover, the probe card 12 held between the bumps 17 and the isolated patterns 19 cannot be elongated in the region in which the isolated patterns 19 are formed densely but is elongated only in the region in which the isolated patterns 19 are formed coarsely. Accordingly, the internal stress acting on the probe card 12 is increased in the region with the dense isolated patterns 19, while it is reduced in the region with the coarse isolated patterns 19, so that the bumps 17 on the probe card 12 are pulled toward the region with the dense isolated patterns 19. As a result, the bumps 17 on the probe card 12 lying between the region with the dense isolated patterns 19 and the region with the coarse isolated patterns 19 move toward the region with the dense isolated patterns 19, which causes the second problem that electrical connections are less likely to be achieved between the bumps 17 and the electrode pads 16 of the semiconductor wafer 10.

SUMMARY OF THE INVENTION

In view of the foregoing, it is therefore a first object of the present invention to prevent the bumps disposed on the peripheral portion of the probe card from moving outwardly toward the sealing member. A second object of the present invention is to prevent the bumps lying between the region with the dense isolated patterns and the region with the coarse isolated patterns, the isolated patterns in each of the regions being formed on the back surface of the probe card to be integral with the bumps, from moving toward the region with the dense isolated patterns.

A wafer burn-in cassette according to the present invention is based on a wafer burn-in cassette comprising: a wafer tray having a wafer mount portion for carrying a semiconductor wafer formed with a plurality of semiconductor chips; a probe card composed of an elastic material and disposed in opposing relation to the wafer mount portion of the wafer tray, the probe card having bumps to be connected to respective electrode pads of the semiconductor chips on the top surface thereof; a holding board for holding the back surface of the probe card; and an annular sealing member disposed on the wafer tray externally of the wafer mount portion to form a first sealed space in combination with the wafer tray and the probe card, the probe card having connection holes for connecting the first sealed space to a second sealed space formed between the probe card and the holding board.

In the wafer burn-in cassette according to the present invention, the probe card has the connection holes for connecting the second sealed space formed between the probe card and the holding board to the first sealed space defined by the wafer tray, the probe card, and the sealing member so that the evacuation of the first sealed space allows the atmosphere to flow from the second sealed space into the first sealed space through the connection holes, resulting in no pressure difference between the first and second sealed spaces. This prevents the bumps disposed on the peripheral portion of the probe card from being pulled and moving toward the sealing member and ensures electrical connections between all the bumps and the corresponding electrode pads of the semiconductor wafer.

In the wafer burn-in cassette according to the present invention, the connection holes are preferably formed in a third region of the probe card which is interposed between a first region of the probe card which is in opposing relation to the wafer mount portion of the wafer tray and a second region of the probe card which is in contact with the sealing member.

When the first sealed space is evacuated, the arrangement prevents the portions of the probe card surrounding the connection holes from being brought into close contact with the semiconductor wafer and ensures the ingression of the atmosphere flowing from the second sealed space into the first sealed space through the connection holes.

In the wafer burn-in cassette according to the present invention, the connection holes are preferably formed dispersively in the region of the probe card in opposing relation to the wafer mount portion of the wafer tray.

In the arrangement, variations in the degree of elongation of the probe card resulting from the evacuation of the first sealed space are evenly distributed over the surface of the probe card, so that the bumps on the probe card are prevented from moving greatly in a specified direction and electrical connections are surely provided between all the bumps and the corresponding electrode pads of the semiconductor wafer.

In the wafer burn-in cassette according to the present invention, the probe card has isolated patterns formed on the back surface thereof integrally with the individual bumps and the connection holes are preferably formed in the probe card to fall on a line in which the isolated patterns are densely placed such that internal stress acting on the probe card is reduced thereby.

When the probe card is elongated along the surface thereof, the arrangement reduces the difference between the internal stress exerted along the line in which the isolated patterns are densely placed and the internal stress exerted along the line in which the isolated patterns are coarsely placed, which prevents the bumps provided on the probe card from moving along the line in which the isolated patterns are densely placed and ensures connections between the bumps and the corresponding electrode pads of the semiconductor chips.

A method of manufacturing the probe card for use in the wafer burn-in cassette according to the present invention comprises: a metal-film forming step of forming a metal film over the entire back surface of a probe card body; a through-hole forming step of exposing, to a laser beam, the bump formation portions of the probe card body formed with the metal film to be formed with the bumps and the connection hole formation portions of the probe card body to be formed with the connection holes and thereby forming through holes in each of the formation portions; a bump forming step of forming the bumps on the top surface of the probe card body by electroplating the top surface of the probe card body such that the bumps extend through the through holes to be integral with the metal film; an etching step of selectively etching the metal film to form, on the back surface of the probe card body, the isolated patterns composed of the metal film integral with the bumps and remove the regions of the metal film in opposing relation to the through-hole formation portions of the probe card body; and a bump removing step of removing, of all the bumps, the bumps not having the metal film on the back surface of the probe card.

In accordance with the method of manufacturing the probe card according to the present invention, the connection holes extending vertically through the probe card can be formed in the same step of forming the through holes in which the bumps are to be formed and the metal film formed on the back surface of the probe card formed with the connection holes can be removed in the same step of forming the isolated patterns, which allows the formation of the connection holes without increasing the number of process steps.

In the method of manufacturing the probe card according to the present invention, the through-hole forming step preferably includes the step of adjusting the diameter of each of the through holes formed in the through-hole formation portions of the probe card body to be smaller than the diameter of each of the through holes formed in the bump formation portions of the probe card body.

In the arrangement, the bumps formed at the portions to be formed with the connection holes are lower in level than the true bumps. Therefore, even when the bump is left at the portion to be formed with the connection hole, the bump presents no problem since it is prevented from being connected to the corresponding electrode pad of the semiconductor wafer.

In the method of manufacturing the probe card according to the present invention, the through-hole forming step preferably includes the step of forming the through holes in each of the regions of the probe card body in opposing relation to and not in opposing relation to the semiconductor chips by repeatedly exposing the probe card body to the laser beam, while progressively moving a mask having apertures corresponding to the respective bump formation portions of the probe card body by a predetermined distance at a time and the etching step includes the step of removing the region of the metal films not in opposing relation to the semiconductor chips.

The arrangement ensures the formation of the through holes in the region of the probe card body not in opposing relation to the semiconductor chips.

In the method of manufacturing the probe card according to the present invention, the through-hole forming step preferably includes the step of forming the through holes by repeatedly exposing the probe card body to the laser beam, while progressively moving a mask having apertures corresponding to the respective bump formation portions and through-hole formation portions of the probe card body by a predetermined distance at a time.

The arrangement allows the formation of the through holes evenly distributed over each of the regions of the probe card body in opposing relationship to the semiconductor chips.

DETAILED DESCRIPTION OF THE INVENTION

EMBODIMENT 1

Figure 1:
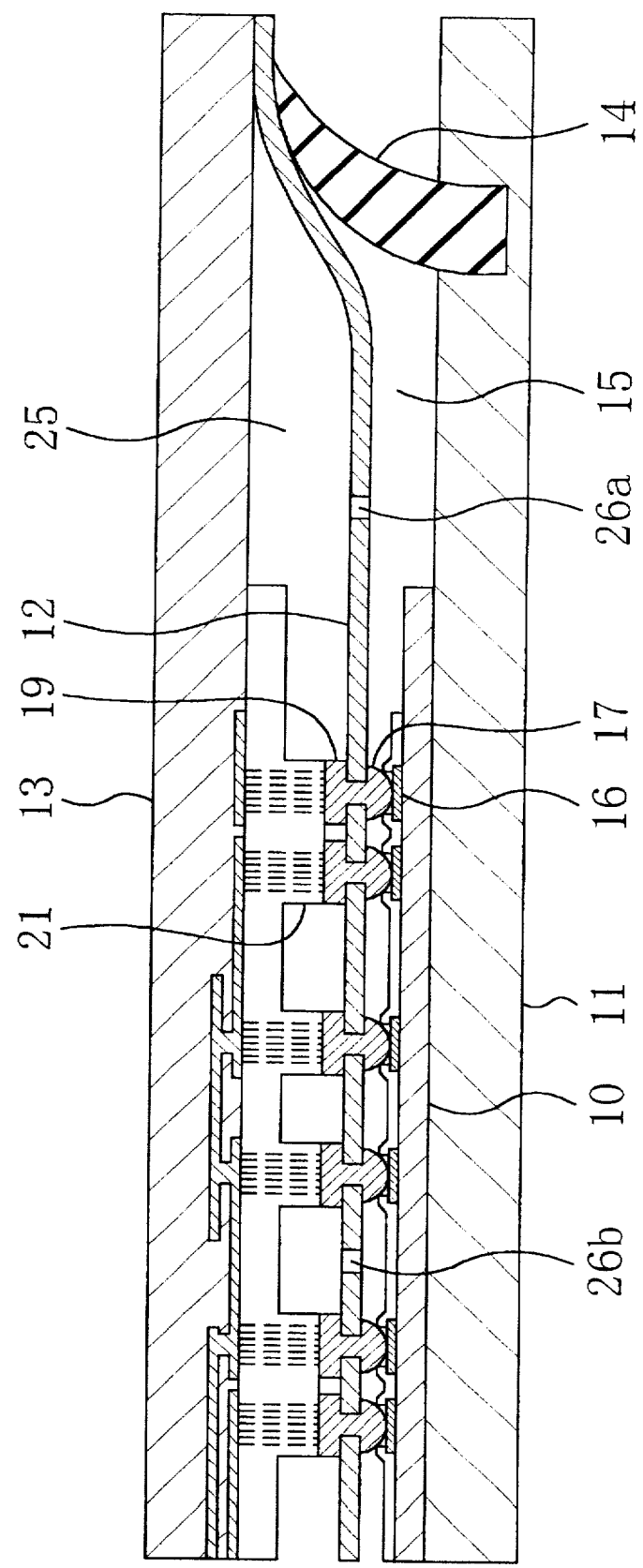
FIG. 1 is a partial cross-sectional view of a wafer burn-in cassette according to a first embodiment of the present invention.

Referring to FIGS. 1 and 2, a wafer burn-in cassette according to a first embodiment of the present invention will be described.

FIG. 1 shows the cross-sectional structure of the wafer burn-in cassette according to the first embodiment.

As illustrated in FIG. 1, the wafer burn-in cassette according to the first embodiment comprises: a wafer tray 11 having a wafer mount portion for carrying a semiconductor wafer 10 formed with a plurality of semiconductor chips; a probe card 12 composed of an elastic material such as a polyimide resin, disposed in opposing relation to the wafer mount portion of the wafer tray 11, and having bumps 17 to be connected to the respective electrode pads 16 of the semiconductor chips on the top surface thereof; a wiring board 13 as a holding board to be brought in contact with the back surface of the probe card 12 via anisotropic conductive rubber 21; and an annular sealing member 14 disposed on the wafer tray 11 externally of the wafer mount portion, similarly to the conventional wafer burn-in cassette.

The peripheral portion of the probe card 12 is held by the wiring board 13 as the holding board via a rigid ring 18, similarly to the conventional wafer burn-in cassette, though it is not shown in FIG. 1. On the other hand, isolated patterns 19 each composed of, e.g., a copper film are formed on the back surface of the probe card 12 integrally with the bumps 17 such that the probe card 12 is held between the bumps 17 and the isolated patterns 19, as shown in FIG. 1.

Figure 10:
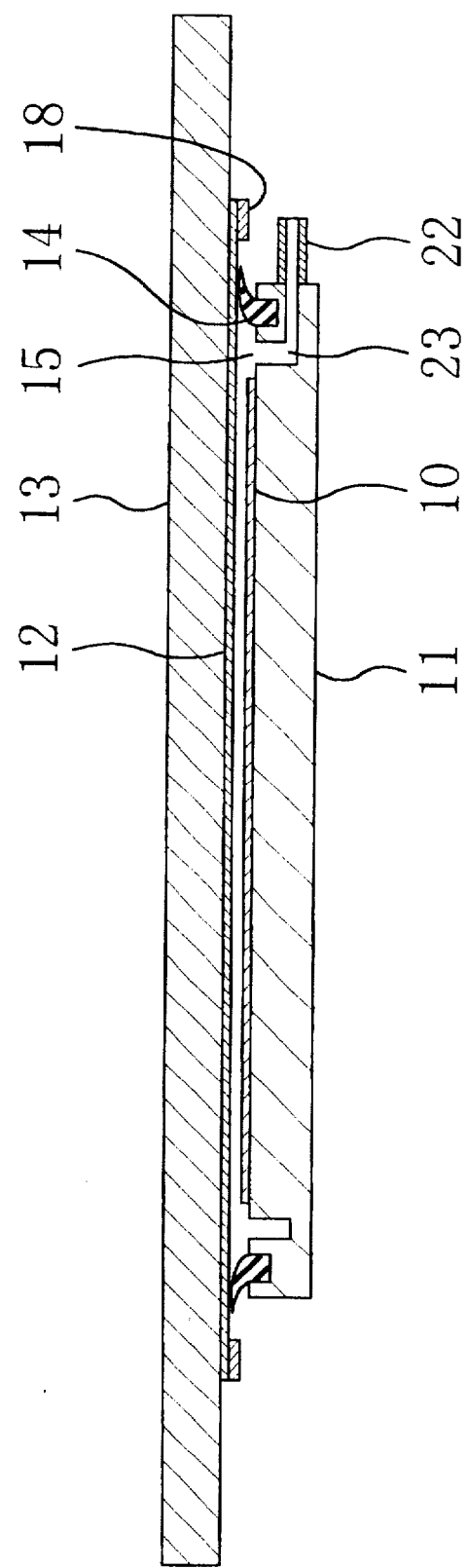
FIG. 10 is a cross-sectional view of a conventional wafer burn-in cassette.
Figure 11:
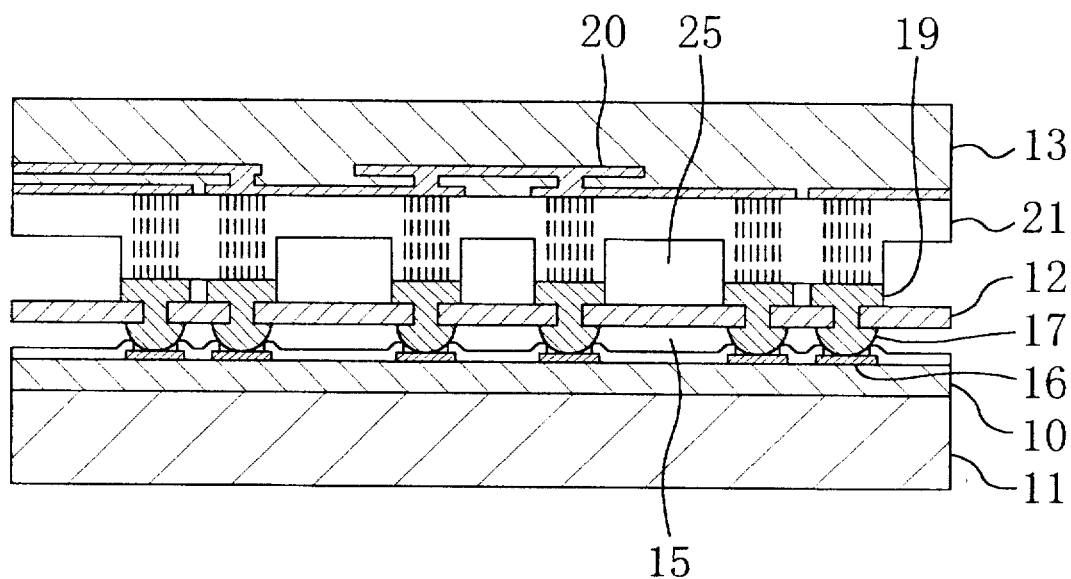
FIG. 11 is a partially enlarged cross-sectional view of the conventional wafer burn-in cassette.
Figure 12:
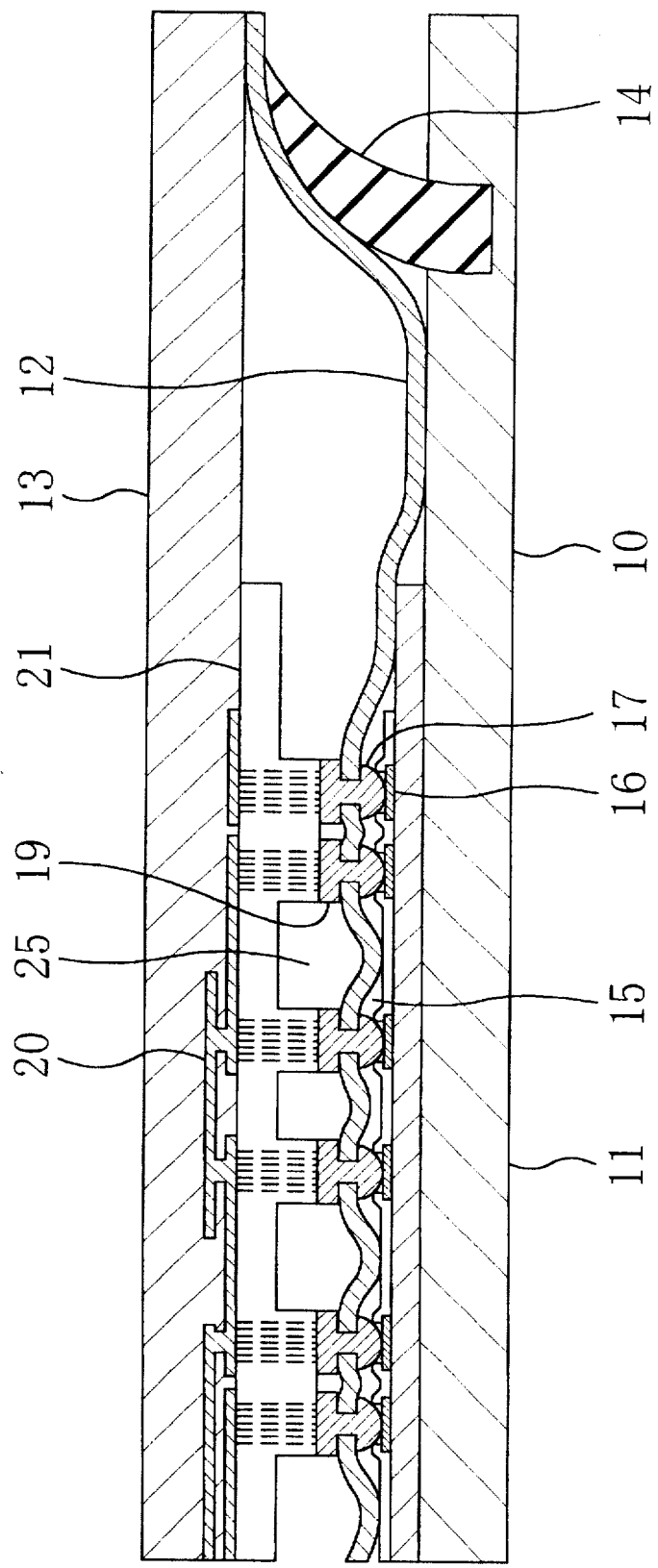
FIG. 12 is a partially enlarged cross-sectional view for illustrating the problems associated with the conventional wafer burn-in cassette.

A valve 22 connected to evacuating means (not shown) is provided on a side face of the wafer tray 11, though it is not shown in FIG. 1 (see FIG. 10).

Since the peripheral portion of the probe card 12 is pressed against the wiring board 13 by the annular sealing member 14, similarly to the conventional wafer burn-in cassette, a first sealed space 15 is defined by the wafer tray 11, the probe card 12, and the sealing member 14, while a second sealed space is formed between the probe card 12 and the wiring board 13.

The first embodiment is characterized in that connection holes 26a are formed in the peripheral region of the probe card 12 which is interposed between the wafer region of the probe card 12 in opposing relation to the wafer mount portion of the wafer tray 11 and the region of the probe card 12 in close contact with sealing member 14, while connections holes 26b are formed dispersively in the wafer region of the probe card 12.

Figure 2A:
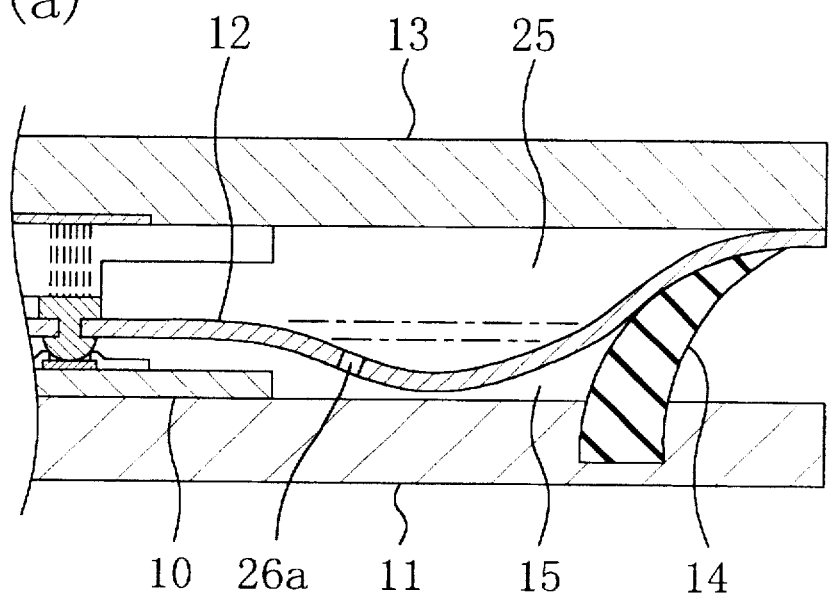
FIGS. 2(a) and 2(b) are partial cross section views for illustrating the operation of the wafer burn-in cassette according to the first embodiment.

When the first sealed space 15 is evacuated via the valve (not shown) in the burn-in test board according to the first embodiment, the probe card 12 composed of an elastic material is pulled toward the first sealed space 15 and warped, as shown in FIG. 2(a), but subsequently returns to the state parallel with the wafer tray 11, as indicated by the dot-dash lines, because the pressure difference between the first and second sealed spaces 15 and 25 is eliminated by the atmosphere flowing from the second sealed space 25 into the first sealed space 15 through the connection holes 26. In this case, since the peripheral portion of the wafer tray 11 is not covered with the semiconductor wafer 10 mounted on the wafer tray 11, the distance between the probe card 12 and the wafer tray 11 is larger by the thickness of the wafer 10 at the peripheral portion of the wafer tray 11 than at the wafer mount portion of the wafer tray 11, so that the portions of the probe card 12 surrounding the connection holes 62a are never brought into close contact with the wafer tray 11 immediately after the evacuation of the first sealed space 15. Consequently, the probe card 12 returns to the state parallel with the wafer tray 11, as indicated by the dot-dash lines, which prevents the bumps 17 formed on the peripheral portion of the probe card 12 from moving outwardly toward the sealing member 14 and ensures electrical connections between the bumps 17 and the electrode pads 16 of the semiconductor wafer 10.

Of the probe card 12 elongated by the evacuation of the first sealed space 15, the region with the connection holes 26b is elongated to a higher degree than the region without the connection holes 26b. However, since the first embodiment has formed the connections holes 26b dispersively in the wafer region of the probe card 12 in opposing relation to the wafer mount portion of the wafer tray 11, variations in the degree of elongation of the probe card 12 are evenly distributed over the surface of the probe card 12, which prevents the bumps 17 on the probe card 12 from moving greatly in a specified direction and ensures electrical connections between the bumps 17 and the electrode pads of the semiconductor wafer 10.

Figure 2B:
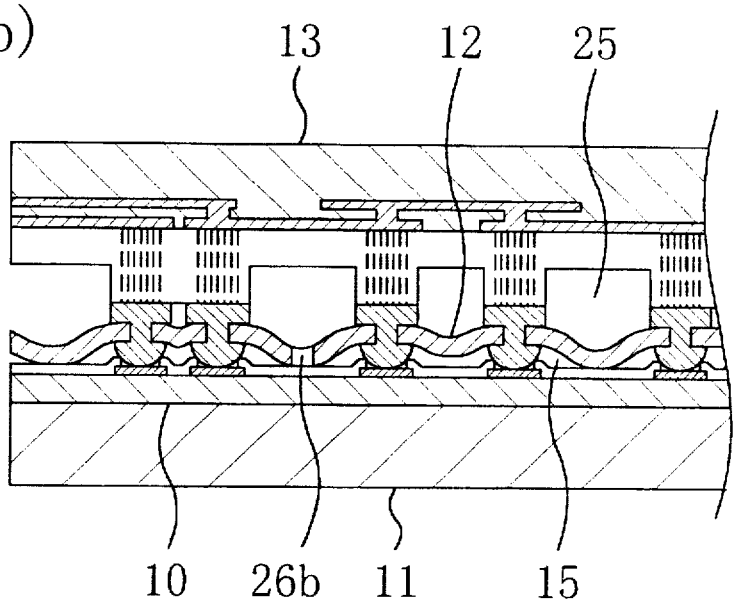

In the case where the connection holes 26 are not formed in the peripheral region of the probe card 12 and the connection holes 26 are formed only in the wafer region of the probe card 12, it is preferred to gradually evacuate the first sealed space 15, since rapid evacuation of the first sealed space 15 may bring the portions of the probe card 12 surrounding the connection holes 26 into close contact with the semiconductor wafer 10, as shown in FIG. 2(b).

As will be understood from the foregoing description, the time required to eliminate the pressure difference between the first and second sealed spaces 15 and 25 is reduced accordingly with an increased number of connection holes 26. However, since the degree of elongation of the probe card 12 is more likely to vary depending on the distribution of the connection holes, the number and placement of the connection holes 26 are preferably optimized in consideration of the time required to eliminate the pressure difference between the first and second sealed spaces 15 and 25 and variations in the degree of elongation of the probe card 12.

Preferably, the diameter of each of the connection holes 26 is so determined as to prevent the passage of a cleaning liquid for cleaning the probe card 12 and to allow the passage of gas obtained by gasifying the cleaning liquid. This prevents the ingression of the cleaning liquid into the space between the probe card 12 and the wiring board 13 in cleaning the probe card 12 with the cleaning liquid and, even when the solution liquid has entered the space between the probe card 12 and the wiring board 13, the cleaning liquid can easily be gasified and removed.

EMBODIMENT 2

Figure 3:
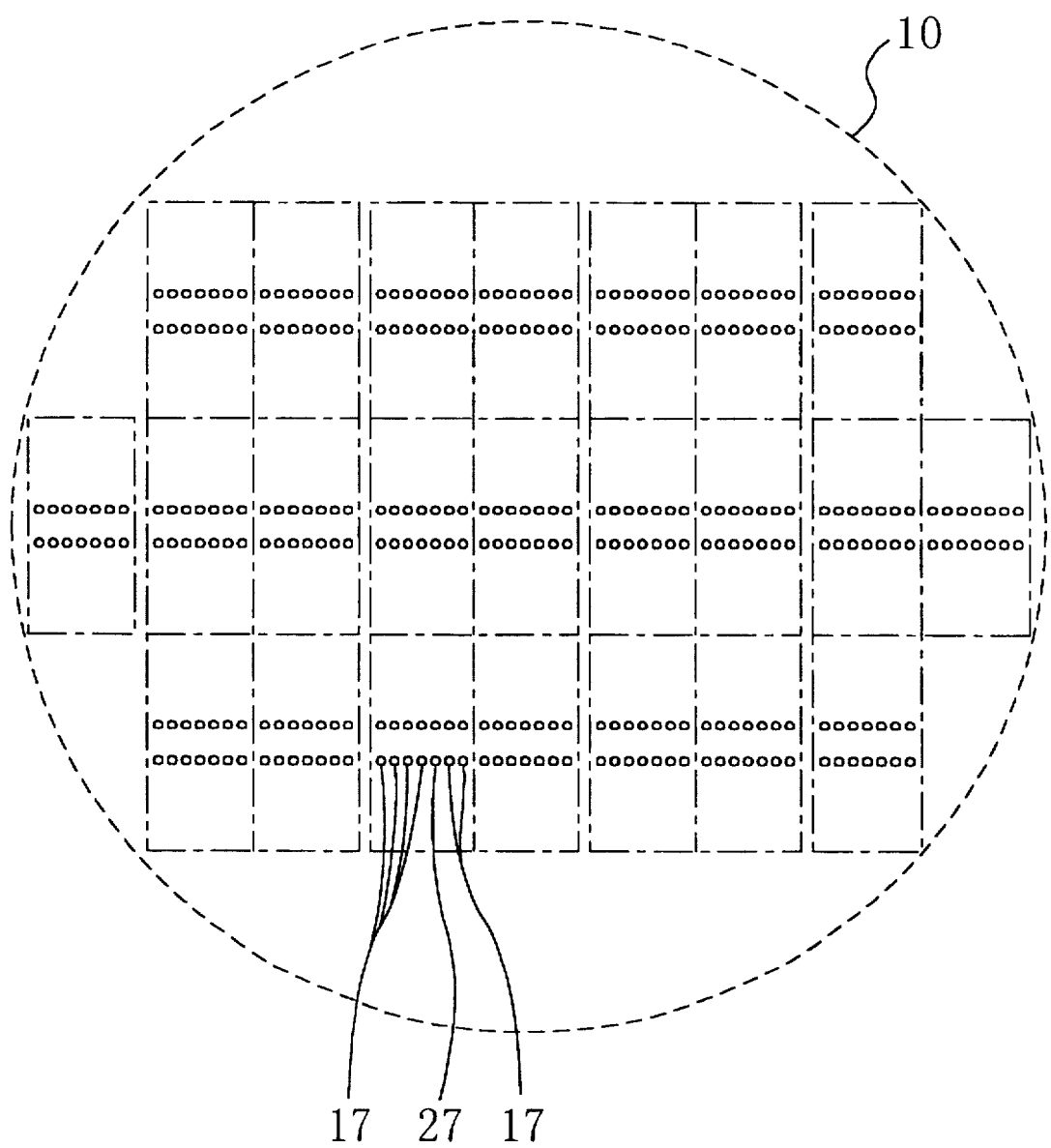
FIG. 3 is a plan view showing the top-surface structure of a probe card for use in the wafer burn-in cassette according to a second embodiment of the present invention.
Figure 4:
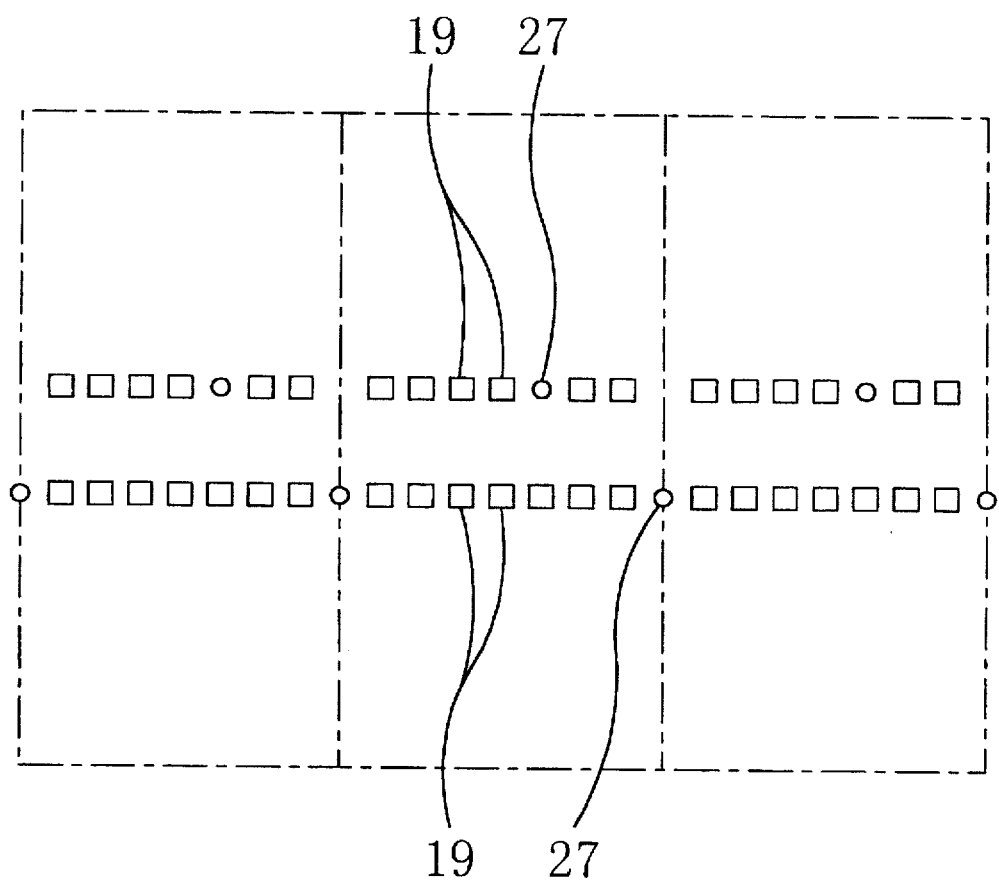
FIG. 4 is a partially enlarged plan view showing the back-surface structure of the probe card for use in the wafer burn-in cassette according to the second embodiment.

Referring to FIGS. 3 and 4, a wafer burn-in cassette according to a second embodiment of the present invention will be described. FIG. 3 shows the plan structure of the top-surface region (region enclosed in the broken circle) of a probe card 12 in opposing relation to a semiconductor wafer 10. FIG. 4 shows the partially enlarged structure of the back surface of the probe card 12. It is to be noted that the rectangles defined by the dot-dash lines in FIGS. 3 and 4 indicate the regions of the probe card 12 corresponding to semiconductor chips formed in the semiconductor wafer 10.

The wafer burn-in cassette according to the second embodiment also comprises: a wafer tray 11 for carrying the semiconductor wafer 10; the probe card 12 composed of an elastic material such as a polyimide resin and having a plurality of bumps 17 on the top surface thereof; a holding board 13 for holding the back surface of the probe card 12 via anisotropic conductive rubber 21; an annular sealing member 14 disposed around the perimeter of the wafer tray 11; isolated patterns 19 for holding the probe card 12 in combination with the bumps 17; and a first sealed space 15 defined by the wafer tray 11, the probe card 12, and the sealing member 14, similarly to the conventional wafer burn-in cassette and the wafer burn-in cassette according to the first embodiment.

The second embodiment is characterized in that the probe card 12 is formed with through holes 27 falling on lines in which the isolated patterns 19 are densely placed such that internal stress acting on the probe card 12 during the evacuation of the first sealed space 15 defined by the probe card 12 and the sealing member 14 or the heating of the probe card 12 is reduced by the through holes 27.

Specifically, when there is a sufficient space for the through hole 27 between the adjacent isolated patterns 19, as shown in FIG. 4, the through hole 27 is formed between the adjacent isolated patterns 19. When there is no space for the through hole 27 between the adjacent isolated patterns 19, the through hole 27 is formed on a scribing line between the adjacent semiconductor chips.

The line in which the isolated patterns 19 are densely placed does not necessarily extend laterally of the probe card 12 as shown in FIG. 3, but may extend vertically or obliquely of the probe card 12 shown in FIG. 3. In most cases, the line in which the isolated patterns 19 are densely placed on the probe card 12 coincides with the line in which the bumps 17 are densely placed. In the case where each of the isolated patterns 19 is connected to a plurality of bumps 17, however, the line may coincide with the direction in which the isolated patterns 19 extend.

Although the internal stress acting on the probe card 12 is increased on the line in which the isolated patterns 19 are densely placed (line in which the bumps 17 or the isolated patterns 19 are formed at reduced intervals in FIG. 3 or 4), it is decreased in the second embodiment owing to the through holes 27 formed in the probe card 12 to fall on the line in which the isolated patterns 19 are denselyplaced. This prevents the bumps 17 formed on the probe card 12 from moving along the line in which the isolated patterns 19 are densely placed and ensures connections between the bumps 17 and the electrode pads 16 of the semiconductor chips.

EMBODIMENT 3

Figure 5:
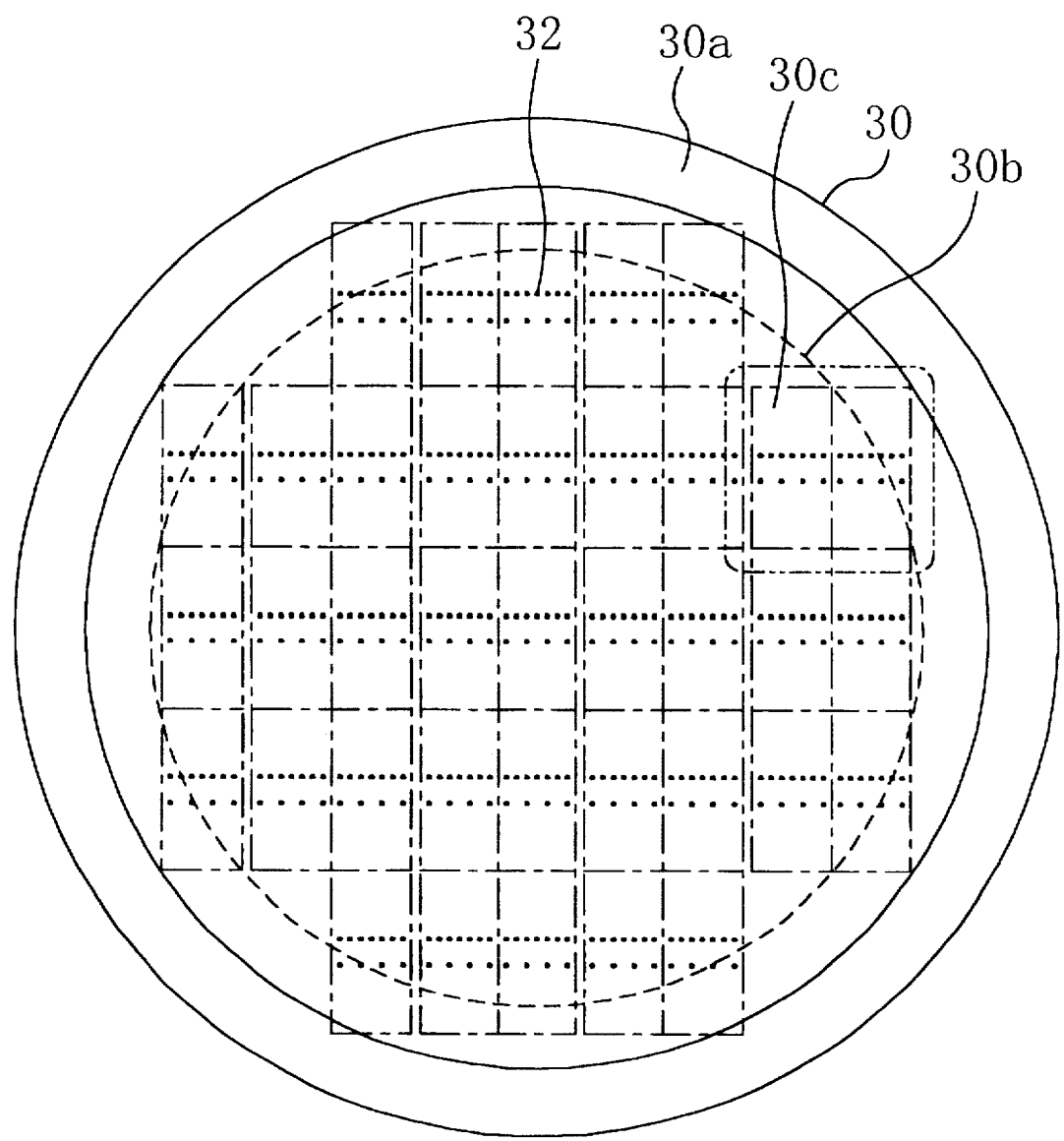
FIG. 5 is a plan view of a probe card body for illustrating a through-hole forming step of a method of manufacturing a probe card according to a third embodiment of the present invention.

Referring to FIGS. 5 to 7, a method of manufacturing a probe card according to a third embodiment of the present invention will be described.

The third embodiment provides a method of manufacturing a probe card for use in the burn-in test board according to the first or second embodiment. Specifically, the third embodiment provides the method of manufacturing the probe card constituted by a probe card body 30 having the bumps 17 to be connected to the corresponding electrode pads 16 of the plurality of semiconductor chips formed in the semiconductor wafer 10 on the top surface thereof, the isolated patterns 19 formed on the back surface thereof integrally with the bumps 17, and through holes 32 (corresponding to the connection holes 26 in the first embodiment or the through holes 27 in the second embodiment) extending vertically through the probe card body 30.

Figure 6A:
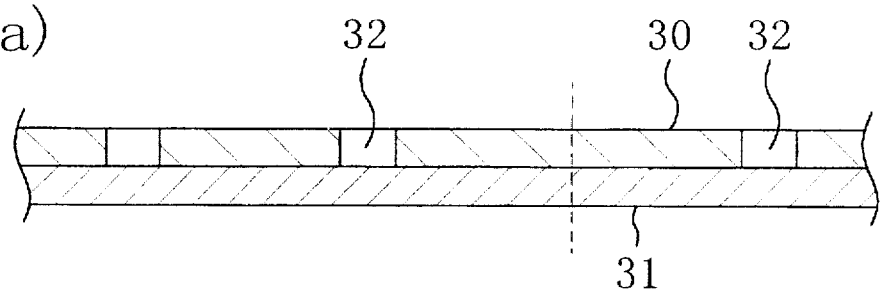
FIGS. 6(a) to 6(d) are cross-sectional views illustrating the individual steps of the method of manufacturing the probe card according to the third embodiment.

First, as shown in FIG. 6(a), a metal film 31 composed of, e.g., copper is deposited over the entire back surface of the probe card body 30 in the form of a sheet composed of, e.g., a polyimide resin. The resulting double-layered base consisting of a polyimide resin and copper may be fabricated by, e.g., laminating a rolled copper foil on a polyimide sheet or coating the rolled copper foil with uncured polyimide (application). Thereafter, the probe card body 30 is repeatedly exposed to a laser beam, while a mask formed with apertures corresponding to the bump formation portions (portions to be formed with the bumps) of the probe card body 30 is moved progressively by a predetermined distance at a time, thereby forming the through holes 32. In this case, the mask is preferably formed with the apertures corresponding to the repetition pattern of the bump formation portions in a single or plurality of semiconductor chips, which reduces the number of laser beam irradiations and the number of mask movements.

Figure 7A:
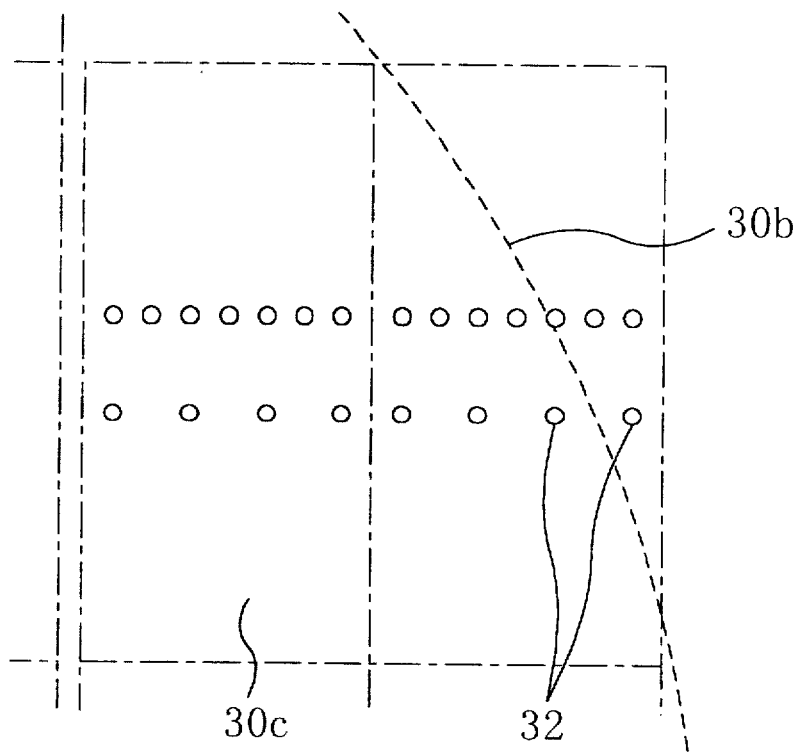
FIGS. 7(a) and 7(b) are partially enlarged crosssectional views of the probe card body for illustrating the individual steps of the method of manufacturing the probe card according to the third embodiment.
Figure 7B:
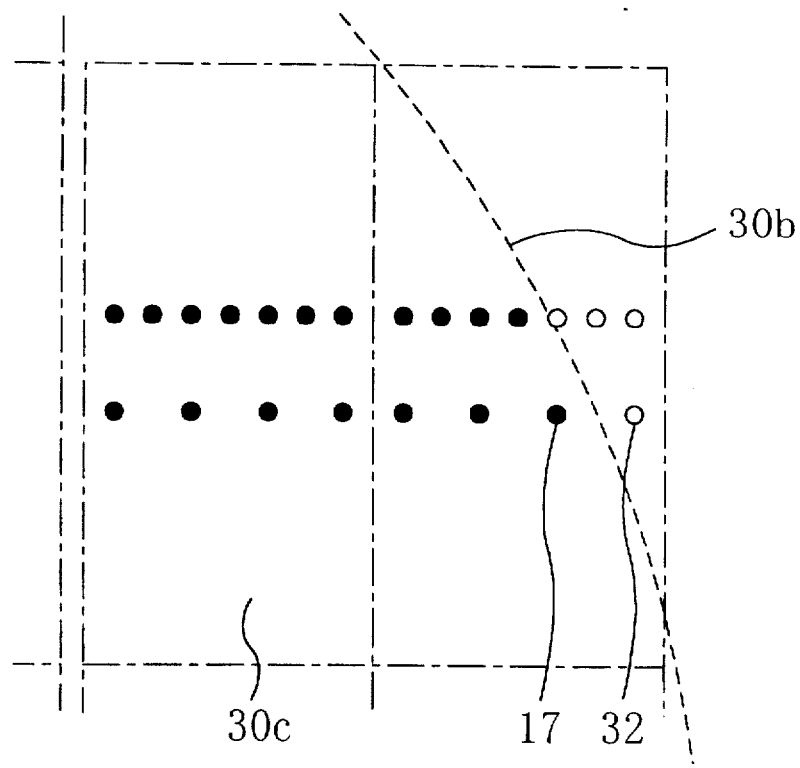

FIG. 5 shows the plan structure of the probe card body 30 with the through holes 32 formed by exposure to the laser beam, in which are depicted: a region 30a held by the rigid ring 18 (see FIG. 10); a wafer region 30b (enclosed in the broken circle) in opposing relation to the semiconductor wafer 10 in the wafer burn-in process; and semiconductor chip regions 30c (enclosed in the squares defined by the dot-dash lines) in opposing relation to the individual semiconductor chips formed in the semiconductor wafer 10. FIGS. 7(a) and 7(b) are enlarged views of the region defined by the two-dot-dash lines in FIG. 5.

As shown in FIGS. 5 and 7(a), since the semiconductor chip regions extend partly or entirely off the wafer region 30b in the process of forming the through holes shown in FIG. 6(a), the through holes 32 are also formed in the region not in opposing relation to the semiconductor chips by laser irradiation using the mask. In FIG. 5, the solid circles indicate the through holes 32 formed by laser irradiation using the mask. In FIGS. 6(a) to 6(d), the left-hand portions of the broken lines indicate bump formation regions to be formed with the bumps 17, while the right-hand portions of the broken lines indicate through-hole formation regions to be formed with the through holes 32.

Figure 6B:
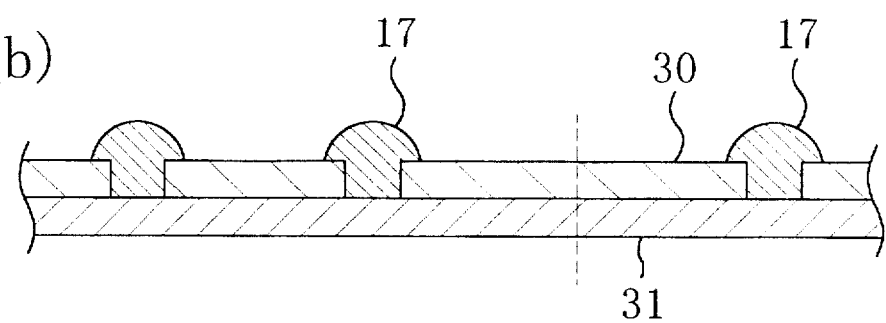

Next, as shown in FIG. 6(b), the top surface of the probe card body 30 is electroplated such that the bumps 17 are formed on the top surface of the probe card body 30 integrally with the metal film 31 exposed in all the through holes. The probe card 30 is thus held between the bumps 17 and the metal film 31.

Figure 6C:
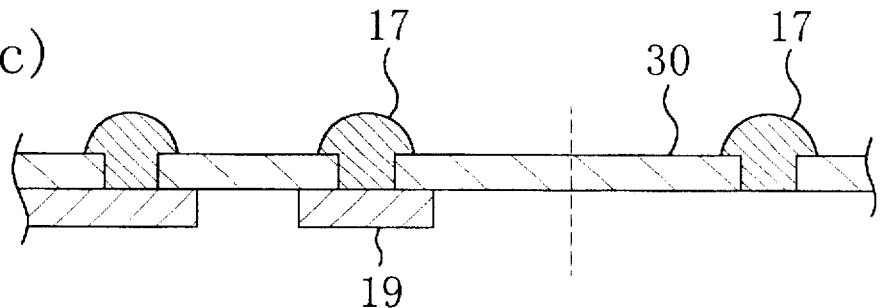

Next, as shown in FIG. 6(c), selective etching is performed with respect to the metal film 31 to remove the metal film 31 thoroughly from the through-hole formation region and form the isolated patterns 19 shown in the first and second embodiments.

Figure 6D:
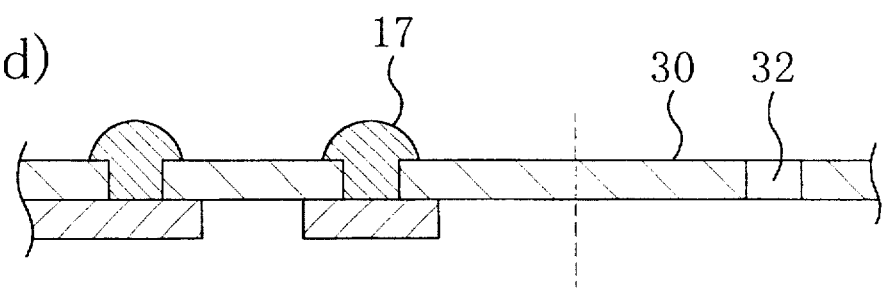

Next, as shown in FIG. 6(d), the bump 17 having no metal film 31 on the back surface thereof is removed, with the result that the bumps 17 are left in the wafer region 30b of the probe card body 30 and no bump 17 is left externally of the wafer region 30b of the probe card body 30. In this case, the bump 17 exterior to the wafer region 30b can easily be removed since it has no metal film 31 on the back surface thereof.

Figure 8A:
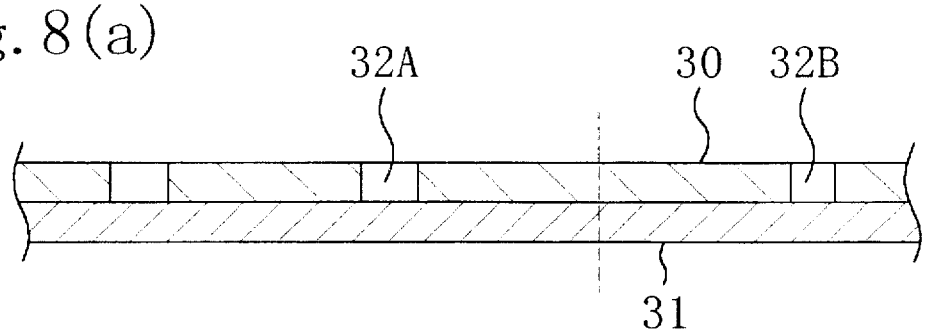
FIGS. 8(a) to 8(c) are cross-sectional views illustrating the individual steps of the method of manufacturing the probe card according to a variation of the third embodiment.
Figure 8B:
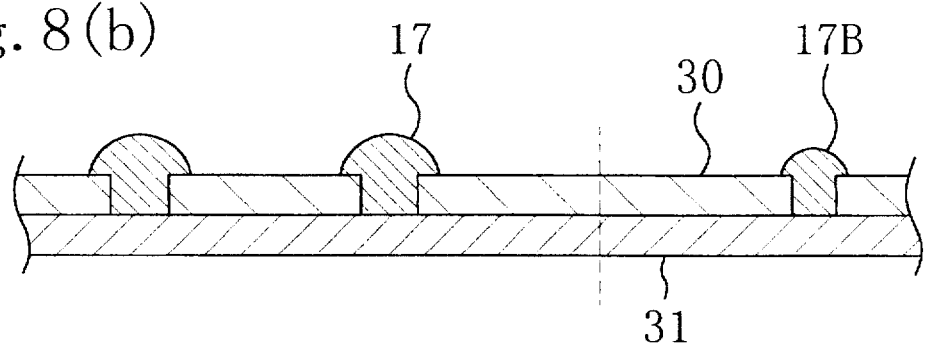
Figure 8C:
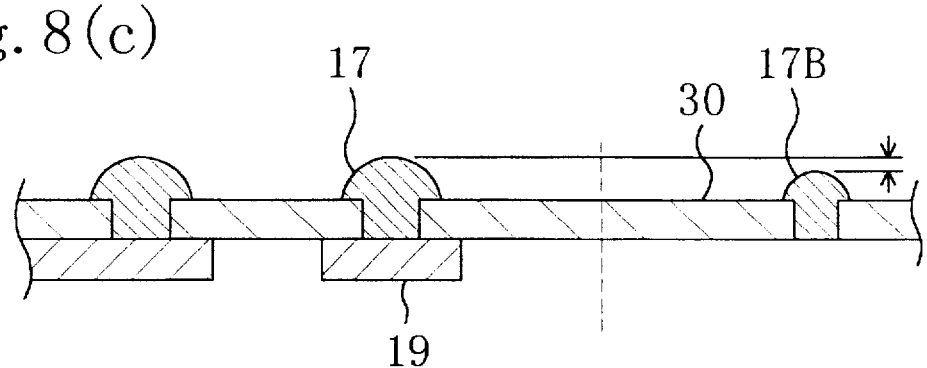

Although the through holes 32 formed in the probe card body 30 have equal diameters in the third embodiment, a through hole 32B formed in the through-hole formation region preferably has a diameter smaller than that of a through hole 32A formed in the bump formation region of the probe card body 30. As a result, the bump 17B formed in the through-hole formation region is lower in level than the true bumps 17 formed in the bump formation region, as shown in FIG. 8(b). Even when the bump 17B lower in level is left after the metal film 31 is removed from the back surface thereof, no problem occurs since the bump 17B is prevented from contact with the corresponding electrode pad 17 of the semiconductor integrated circuit, as shown in FIG. 8(c).

Figure 9:
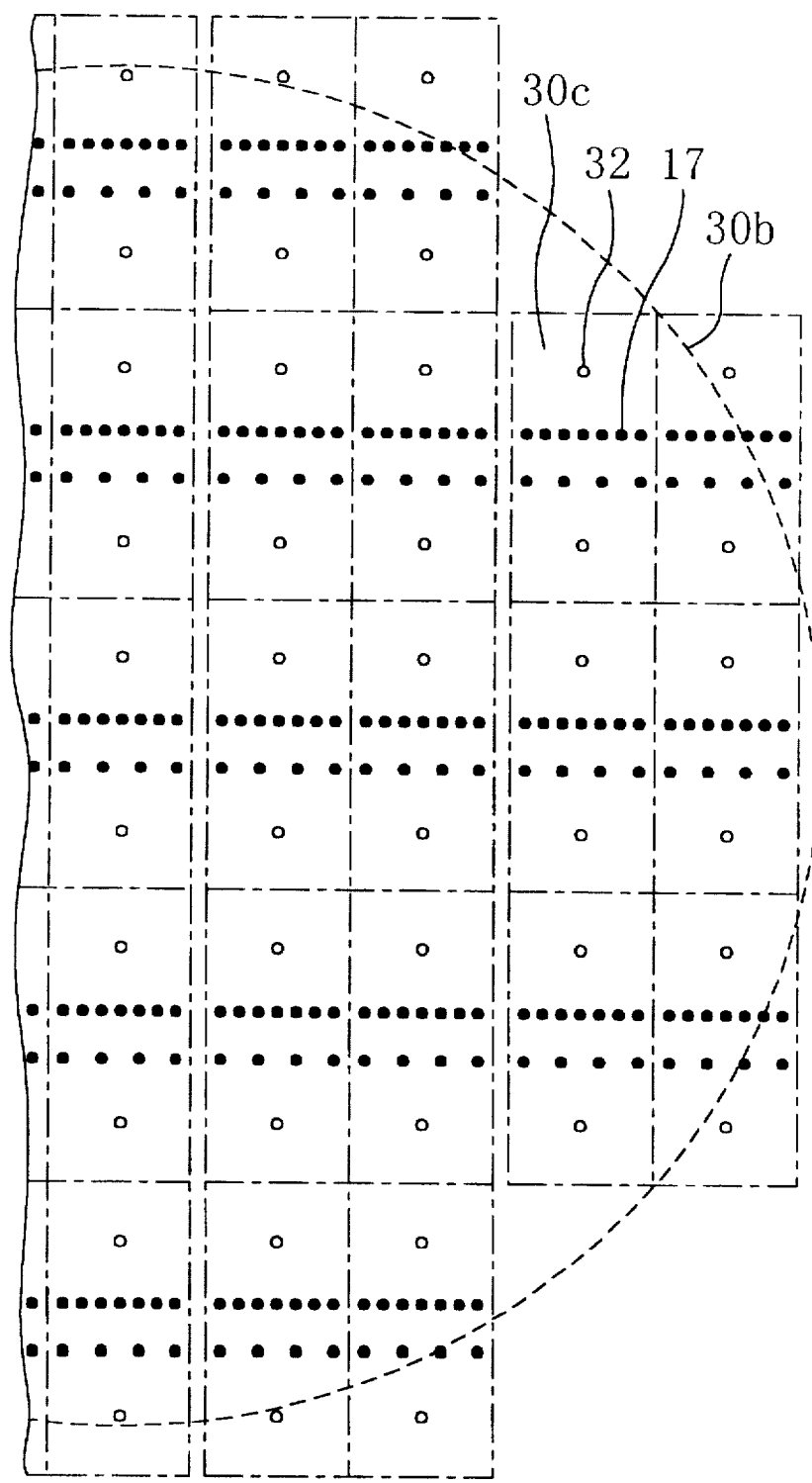
FIG. 9 is a partially enlarged plan view of the probe card body for illustrating the through-hole forming step of the method of manufacturing the probe card according to the variation of the third embodiment.

Although the third embodiment has formed the through holes 32 in each of the regions of the probe card body 30 in opposing relation to and not in opposing relation to the semiconductor chips by repeatedly exposing the probe card body 30 to the laser beam, while progressively moving the mask formed with the apertures corresponding to the bump formation portions of the probe card body 30 by a predetermined distance at a time, the through holes 32 may also be formed by repeatedly exposing the probe card body 30 to a laser beam, while progressively moving a mask formed with apertures corresponding to the bump formation portions of the probe card body 30 to be formed with the bumps 17 and to the through-hole formation portions of the probe card body 30 to be formed with the through holes by a predetermined distance at a time, as shown in FIG. 9.

What is claimed is:

1. A wafer burn-in cassette, comprising:
    a wafer tray having a wafer mount portion for carrying a semiconductor wafer formed with a plurality of semiconductor chips;
    a probe card composed of an elastic sheet and disposed opposite the wafer mount portion of said wafer tray, said probe card having bumps to be connected to respective electrode pads of said semiconductor chips on a first surface thereof which faces the wafer mount portion;
    a holding board for holding a second surface of said probe card, the second surface not facing the wafer mount portion; and
    an annular sealing member disposed on said wafer tray externally of the wafer mount portion to form a first sealed space in combination with said wafer tray and said probe card,
said probe card having connection holes for connecting said first sealed space to a second sealed space formed between said probe card and said holding board.

2. A wafer burn-in cassette according to claim 1, wherein
    said probe card comprises: a first region facing the wafer mount portion of said wafer tray; a second region being in contact with said annular sealing member; and a third region interposed between said first and second regions, and
    said connection holes are formed in the third region of said probe card.

3. A wafer burn-in cassette according to claim 1, wherein
    said connection holes are formed in a first region of said probe card, said first region facing the wafer mount portion of said wafer tray.

4. A wafer burn-in cassette according to claim 1, wherein said probe card has isolated patterns formed on the second surface thereof integrally with said individual bumps and said connection holes are formed in said probe card to fall on a line in which said isolated patterns are densely placed such that internal stress acting on said probe card is reduced thereby.

5. A method of manufacturing the probe card for use in the wafer burn-in cassette according to claim 1, said method comprising the steps of:

forming a metal film on the second surface of said elastic sheet;

forming through holes in first portions of said elastic sheet in which said bumps are to be formed and second portions of said elastic sheet in which said connection holes are to be formed, such that each of the through holes reaches the metal film, by irradiating the first and second portions with a laser beam;

electroplating the first surface of said elastic sheet, to fill in the through holes and form said bumps in the first and second portions, each of said bumps protruding from the first surface of said elastic sheet and reaching the metal film to be continuous with the metal film;

selectively etching the metal film such that no metal film exists on the second portions of said elastic sheet while isolated patterns each of which is composed of the metal film and is continuous with any of said bumps are formed on the second surface of said elastic sheet; and removing some of said bumps which are formed in the second portions of said elastic sheet, thereby to form said connection holes.

6. A method of manufacturing the probe card according to claim 5, wherein said step of forming the through holes includes a step of adjusting the diameter of each of the through holes formed in the second portions of said elastic sheet to be smaller than the diameter of each of the through holes formed in the first portions of said elastic sheet.

7. A method of manufacturing the probe card according to claim 5, wherein said step of forming the through holes includes a step of repeatedly moving a mask for a predetermined distance above said elastic sheet, the mask having apertures facing the first and second portions of said elastic sheet, to irradiate the first and second portions of said elastic sheet, thereby to form the through holes in the first and second portions of said elastic sheet.

8. A method of manufacturing the probe card according to claim 5, wherein said step of forming the through holes includes a step of repeatedly moving a mask for a predetermined distance above said elastic sheet, the mask having apertures facing the first portions of said elastic sheet, to irradiate the first and second portions of said elastic sheet, thereby to form the through holes in the first and second portions of said elastic sheet.

* * * * *